(12) United States Patent
Menon et al.

(10) Patent No.: US 7,333,689 B2
(45) Date of Patent: Feb. 19, 2008

(54) PHOTONIC INTEGRATED DEVICES HAVING REDUCED ABSORPTION LOSS

(75) Inventors: Vinod M. Menon, Lawrenceville, NJ (US); Milind R. Gokhale, Princeton, NJ (US); Stephen R. Forrest, Princeton, NJ (US); Yu Huang, Princeton, NJ (US); Fengnian Xia, Plainsboro, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 11/241,003

(22) Filed: Sep. 30, 2005

(65) Prior Publication Data

US 2007/0077017 A1    Apr. 5, 2007

(51) Int. Cl.
*G02B 6/26* (2006.01)
*G02B 6/10* (2006.01)

(52) U.S. Cl. ............................ 385/28; 385/50; 385/131

(58) Field of Classification Search ................ 385/28, 385/50, 129–132; 372/45.01
See application file for complete search history.

(56) References Cited

U.S. PATENT DOCUMENTS

| | | | |
|---|---|---|---|
| 5,039,189 A | 8/1991 | Lytel et al. ................... 385/2 |
| 5,078,516 A | 1/1992 | Kapon et al. ................ 385/129 |
| 5,140,149 A | 8/1992 | Sakata et al. ............. 250/211 J |
| 5,208,878 A | 5/1993 | Thulke ........................ 385/14 |
| 5,325,379 A | 6/1994 | Amann ....................... 372/20 |
| 5,355,386 A | 10/1994 | Rothman et al. ............. 372/50 |
| 5,499,259 A | 3/1996 | Makita ........................ 372/45 |
| 5,500,867 A | 3/1996 | Krasulick ................. 372/38.02 |
| 5,509,094 A | 4/1996 | Minami et al. ............... 385/29 |
| 5,511,084 A | 4/1996 | Amann ....................... 372/20 |
| 5,568,311 A | 10/1996 | Matsumoto ................. 359/344 |
| 5,574,742 A | 11/1996 | Ben-Michael et al. ........ 372/45 |
| 5,623,363 A | 4/1997 | Liou .......................... 359/344 |
| 5,663,824 A | 9/1997 | Koch et al. ................. 359/184 |
| 5,708,671 A | 1/1998 | Siao et al. ................... 372/20 |

(Continued)

FOREIGN PATENT DOCUMENTS

CN    1118527    3/1996

(Continued)

OTHER PUBLICATIONS

Huang, Y., et al., "Reduction of absorption loss in asymmetric twin waveguide laser tapers using argon plasma-enhanced quantum-well intermixing," *IEEE Photonics Techn. Letts.*, 2004, 16(10), 2221-2223.

(Continued)

*Primary Examiner*—Frank G. Font
*Assistant Examiner*—Charlie Peng
(74) *Attorney, Agent, or Firm*—Woodcock Washburn LLP

(57) ABSTRACT

An asymmetric twin waveguide (ATG) structure with quantum-well intermixing in the taper region of the active waveguide is disclosed. The structure comprises a first waveguide, a second waveguide, and a taper formed in the second waveguide. The taper has an intermixed area formed therein comprising a plurality of quantum wells intermixed with a plurality of barriers. The quantum wells and barriers may be intermixed using plasma-enhanced intermixing such as, for example, Argon plasma enhanced intermixing. Quantum-well intermixing reduces absorption loss normally encountered in the movement of light between waveguides.

17 Claims, 3 Drawing Sheets

U.S. PATENT DOCUMENTS

| | | | | |
|---|---|---|---|---|
| 5,715,268 | A | 2/1998 | Lang et al. | 372/50 |
| 5,721,750 | A | 2/1998 | Kwon et al. | 372/44 |
| 5,852,687 | A | 12/1998 | Wickham | 385/14 |
| 5,859,866 | A | 1/1999 | Forrest et al. | 372/50 |
| 5,917,967 | A | 6/1999 | Dubey et al. | 385/14 |
| 5,985,685 | A | 11/1999 | Lealman et al. | 438/31 |
| 6,031,851 | A | 2/2000 | Shimizu et al. | 372/18 |
| 6,051,445 | A | 4/2000 | Dubey et al. | 438/31 |
| 6,167,073 | A | 12/2000 | Botez et al. | 372/46 |
| 6,198,863 | B1 | 3/2001 | Lealman et al. | 385/37 |
| 6,215,295 | B1 | 4/2001 | Smith, III | 324/95 |
| 6,240,233 | B1 | 5/2001 | Weinert et al. | 385/131 |
| 6,246,965 | B1 | 6/2001 | Cockerham et al. | 702/85 |
| 6,310,995 | B1 | 10/2001 | Saini et al. | 385/28 |
| 6,311,003 | B1 | 10/2001 | Dubey et al. | 385/130 |
| 6,314,451 | B1 | 11/2001 | Landsman et al. | 709/203 |
| 6,330,378 | B1 | 12/2001 | Forrest et al. | 385/14 |
| 6,330,387 | B1 | 12/2001 | Salamon et al. | 385/129 |
| 6,335,994 | B1 | 1/2002 | Kato | 385/50 |
| 6,339,496 | B1 | 1/2002 | Koley et al. | 359/344 |
| 6,381,380 | B1 | 4/2002 | Forrest et al. | 385/14 |
| 6,483,863 | B2 | 11/2002 | Forrest et al. | 372/50 |
| 6,490,044 | B1 | 12/2002 | Koch et al. | 356/478 |
| 6,519,374 | B1 | 2/2003 | Stook et al. | 385/2 |
| 6,668,103 | B2 | 12/2003 | Hosoi | 385/2 |
| 6,671,300 | B2 * | 12/2003 | Marsh et al. | 372/45.01 |
| 6,795,622 | B2 | 9/2004 | Forrest et al. | 385/50 |
| 6,819,814 | B2 | 11/2004 | Forrest et al. | 385/14 |
| 6,984,538 | B2 * | 1/2006 | Ooi et al. | 438/22 |
| 6,989,286 | B2 * | 1/2006 | Hamilton et al. | 438/36 |
| 2002/0018504 | A1 | 2/2002 | Coldren | 372/50 |
| 2002/0031297 | A1 | 3/2002 | Forrest et al. | 385/28 |
| 2002/0097941 | A1 | 7/2002 | Forrest et al. | 385/1 |
| 2003/0012244 | A1 | 1/2003 | Krasulick et al. | 372/50 |
| 2004/0096175 | A1 | 5/2004 | Tolstikhin | 385/131 |

FOREIGN PATENT DOCUMENTS

| | | |
|---|---|---|
| EP | 0 263 640 B1 | 1/1993 |
| FR | 2 337 449 | 7/1977 |
| GB | 2 105 863 A | 3/1983 |
| JP | 2000-228558 | 8/2000 |
| WO | WO 99/67665 | 12/1999 |
| WO | WO 03/007057 A3 | 1/2003 |
| WO | WO 03/102678 A1 | 12/2003 |

OTHER PUBLICATIONS

Tauke-Pedretti, A., et al., "High saturation power and high gain integrated photoreceivers," *IEEE Photonics Technology Letts.*, 2005, 17(10), 2167-2169.

Alferness, R.C., et al., "Vertically coupled INGAASP/INP buried rib waveguide filter," *Applied Physics Letts.*, 1991, 59(20), 2573-2575.

Bach, L., et al., "Wavelength stabilized single-mode lasers by coupled micro-square resonators," *IEEE Photonics Techn. Letts.*, 2003, 15, 377-379.

Bauer, J.G., et al., "High responsivity integrated tapered waveguide PIN photodiode," *Proceedings fo the European Conference on Optical Communication (ECOC)*, Sep. 12-16, 1993, vol. 2, Conf. 19, 277-280.

Bennett, S., et al., "1.8-THz bandwidth, zero-frequency error, tunable optical comb generator for DWDM applications," *IEEE Photonics Techn. Letts.*, 1999, 11(5), 551-553.

Bruckner, H.J., et al., "Taper-Waveguide integration for polarization insensitive InP/InGaAsP based optical amplifiers," *Electron. Lett.*, 1994, 30(16), 1290-1291.

Classen, A., et al., "Comparison of diodes and resistors for measuring chip temperature during thermal characterization of electronic packages using thermal test chips," *IEEE 13th Ann. Semiconductor Thermal Measurement & Management Symposium*, 1997, 198-209.

"Coupled cavity modelocked lasers," *Applied Physics*, http://fb6www.uni-paderborn.de, downloaded Mar. 30, 2005, 3 pages.

"Current work on composite-resonator vertical-cavity lasers," *Coupled Cavity VCSELs*, http://vcsel.micro.uiuc.edu, downloaded Mar. 30, 2005, 4 pages.

Dagenais, M., et al., "Alignment tolerant lasers and silicon waferboard integration," *Passive Alignment Techniques for Optoelectronic Transmitter Arrays*, http:"www.ee.umd.edu/photonics/papers/spie/SPIE97.htm, 1997, 14 pages.

Dagenais, M., et al., "Complex needs drive optoelectronic integration," *Optoelectronics World*, Jul. 1998, 157-160.

den Besten, J.H., et al., "An integrated coupled-cavity 16-wavelength digitally tunable laser," *IPR*, 2002, 1-3.

Forrest, S.R., et al., "Integrated photonics using asymmetric twin-waveguide structures," *IEEE*, 2000, 13-16.

Fredkin, E., et al., "Conservative Logic," *Int. J. Theor. Phys.*, 1982, 21(3/4), 219-253.

Gokhale, M.R., et al., "Uncooled, 10Gb/s 1310 nm electroabsorption modulated laser," presented at OFC 2003 (PD-42), Atlanta, USA, 2003, 4 pages.

Hamamoto, et al., "Insertion-loss-free 2×2 InGaAsP/InP optical switch fabricated using bandgap energy controlled selective MOVPF," *Electron Lett.*, 1995, 31(20), 1779-1781.

Hammond, B., et al., "Integrated wavelength locker for turnable laser applications," *15th Ann. Meeting of the IEEE Lasers & Electro-Optics Soc.*, 2002, 2, 479-480.

He, J.-J., et al., "Photonic integrated circuits and components using quantum well intermixing," *Integrated Optoelectronics, Proc. of SPIE*, 1996, 2891, 2-9.

Johnson, J.E., et al., "Fully stabilized electroabsorption-modulated tunable DBR.laser transmitter for long-haul optical communications," *IEEE J. on Selected Topics in Quantum Electronics*, 2001, 7, 168-177.

Kanjamala, A.P., et al., "Wavelength switching in multicavity lasers," *Am. Inst. Of Physics*, 1997, 71(3), 300-302.

Katsuyuki, U., et al., "Measurement of coupling coefficient and coupling length of GaAs/AlGaAs integrated twin-guide injection lasers prepared by liquid-phase epitaxy," *Trans. IECE Japan*, 1979, E-62, 319-323.

Newkirk, M.A., et al., "1.55 μm multiquantum well semiconductor optical amplifier with low gain ripple and high coupling efficiency for photonic circuit integration," *Electron. Lett.*, 1993, 29(5), 443-444.

O'Dowd, R., et al., "Frequency plan and wavelength switching limits for widely tunable semiconductor transmitters," *IEEE J. Selected Topics in Quantum Electrons*, 2001, 7, 259-269.

Oh, K.R., et al., "Laser amplifier gate switch arrays using reactive ion etching," *Electron. Lett.*, 1996, 32(1), 39-40.

Rabus, D.G., et al., "MMI-coupled ring resonators in GaInAsP-InP," *IEEE Photonics Techn. Letts.*, 2001, 13, 812-814.

Rabus, D.G., et al., "Resonance frequency tuning of a double ring resonator in GaInAsP/InP: Experiment and simulation," *Jpn. J. Appl. Phys.*, 2002, 41, 1186-1189.

Rabus, D.G., et al., "High-Q channel-dropping filters using ring resonators with integrated SOAs," *IEEE Photonics Techn. Letts.*, 2002, 1, 1442-1444.

Saini, S.S., et al., "Compact mode expanded lasers using resonant coupling between a 1.55-μm InGaAsP tapered active region and an underlying coupling waveguide," *IEEE Photonics Technology Letters*, Sep. 1998, 10(9), 1232-1234.

Saini, S.S., et al., "Compact low-loss vertical resonant mode coupling between two well-confined waveguides," *Electronics Letts.*, 1999, 35(14), 2 pages.

Saini, S.S., et al., "Passive active resonant coupler (PARC) platform with mode expander," *IEEE Photonics Techn. Letts.*, 2000, 12(8), 1025-1027.

Sarlet, G., et al., "Control of widely tunable SSG-DBR lasers for dense wavelength division multiplexing," *IEEE J. Lightwave Techn.*, 2000, 18, 1128-1138.

Shi, H., et al., "Relative intensity noise measurements of a widely tunable sampled-grating DBR laser," *IEEE Photonics Techn. Letts.*, 2002, 14, 759-761.

Silva, C.F.C., et al., "A dense WDM source using optical frequency comb generation and widely tunable injection-locked laser filtering techniques," Department of Electrical Engineering, year not available, 4 pages.

Studenkov, P.V., et al., "Efficient Coupling in Integrated Twin-Waveguide Lasers Using Waveguide Tapers", *IEEE Photonics Technology Letters*, 1999, vol. 11, No. 9, pp. 1096-1098.

Studenkov, P.V., et al., "Asymmetric Twin-Waveguide 1.55-μm Wavelength Laser with a Distributed Bragg Reflector", *IEEE Photonics Technology Letters*, 2000, vol. 12, No. 5, pp. 468-470.

Studenkov, P.V., et al., "Monolithic Integration of a Quantum-Well Laser and an Optical Amplifier Using an Asymmetric Twin-Waveguide Structure", *IEEE Photonics Technology Letters*, vol. 10, No. 8, pp. 1088-1090, (1998).

Studenkov, P.V., et al., "Monolithic integration of an all-optical Mach-Zehnder demultiplexer using an asymmetric twin-waveguide structure," *IEEE Photonics Techn. Lett.*, 2001, 13, 600-602.

Suematsu, Y., et al., "Integrated twin-guide AlGaAs laser with multiheterostructure," *IEEE J. Quantum Electron.*, 1973, QE-11(7), 457-460.

Tatsuno, K., et al., "50 GHz spacing, multi-wavelength tunable locker integrated in a transmitter module with a monolithic-modulator and a DFB-laser," *Optical Fiber Commun. Conf.*, 2001, TuB5-1—TuB5-4.

Van, V., et al., "Optical signal processing using nonlinear semiconductor microring resonators," *IEEE J. on Selected Topics in Quantum Electronics*, 2002, 8, 705-713.

Vusirikala, V., et al., "1.55- μm InGaAsP—InP laser arrays with integrated-mode expanders fabricated using a single epitaxial growth," *IEEE J. Selected Topics in Quantum Electronics*, Dec. 1997, 3(6), 1332-1343.

Vusirikala, V., et al., "Compact mode expanders using resonant coupling between a tapered active region and an underlying coupling waveguide," *IEEE Photonics Techn. Letts.*, 1998, 10(2), 203-205.

Wang, H., et al., "A fully integratable, 1.55-μm wavelength, continuously tunable asymmetric twin-waveguide distributed bragg reflector laser," *IEEE Photonics Techn. Lett.*, 2003.

Wei, J., et al., "A high-responsivity high-bandwidth asymmetric twin-waveguide coupled InGaAs-InP-InAlAs avalanche photodiode," *IEEE Photonics Techn. Lett.*, 2002, 14, 1590-1592.

Woodward, S.L., et al., "RIN in multisection MQW-DBR lasers," *IEEE Photonics Technology Letts.*, 1990, 2, 104-108.

Woodward, S.L., et al., "A control loop which ensures high side-mode-suppression ratio in a tunable DBR laser," *IEEE Photonics Techn. Letts.*, 1992, 4, 417-419.

Xia, F.N., et al., "Monolithic integration of a semiconductor optical amplifier and a high bandwidth p-i-n photodiode using asymmetric twin-waveguide technology," *IEEE Photonics Techn. Lett.*, 2003, 15, 452-454.

Xu, L., et al., "Monolithic integration of an InGaAsl'-InP MQW laser/waveguide using a twin-guide structure with a mode selection layer," *IEEE Photon. Technol. Lett.*, 1997, 9, 569-571.

Yakoyama, Y., et al., "Multiwavelength locker integrated wide-band wavelength-selectable light source module," *IEEE Photonics Technollogy Letts.*, 2003, 15, 290-292.

* cited by examiner

PHOTONIC INTEGRATED DEVICES HAVING REDUCED ABSORPTION LOSS

GOVERNMENT LICENSE RIGHTS

The U.S. Government may have a paid-up license in this invention and the right in limited circumstances to require the patent owner to license others on reasonable terms under Grant Number DAAD19-00-1-0415 awarded by the Army Research Office.

CROSS-REFERENCE TO RELATED APPLICATIONS

This application is related by subject matter to U.S. patent application Ser. No. 10/983,366, filed Nov. 8, 2004, and entitled "Twin Waveguide Based Design for Photonic Integrated Circuits," which is a continuation of U.S. patent application Ser. No. 10/642,316 filed Aug. 15, 2003 and entitled "Twin Waveguide Based Design for Photonic Integrated Circuits," now U.S. Pat. No. 6,819,814, which is a continuation of U.S. patent application Ser. No. 09/982,001 filed Oct. 18, 2001 and entitled "Twin Waveguide Based Design for Photonic Integrated Circuits," now U.S. Pat. No. 7,302,124, which is a continuation of U.S. patent application Ser. No. 09/337,785 filed Jun. 22, 1999 and entitled "Twin Waveguide Based Design for Photonic Integrated Circuits," now U.S. Pat. No. 6,381,380.

FIELD OF THE APPLICATION

The present application is related to the field of optical communications, and more particularly to efficient integration of active and passive waveguides comprising quantum wells in photonic integrated circuits.

BACKGROUND

Photonic integrated circuits (PICs) provide an integrated technology platform increasingly used to form complex optical circuits. This technology allows many optical devices to be integrated on a single substrate. For example, PICs may comprise integrated lasers, integrated receivers, waveguides, detectors, semiconductor optical amplifiers (SOAs), and other active and passive optical devices arranged in various configurations.

Asymmetric twin waveguide (ATG) technology has proven to be a promising method for optoelectronic integration by virtue of the need for only a single epitaxial growth step and a simple fabrication process for even the most complex PIC design. The ATG design significantly reduces modal interference by substantially confining different modes of light to propagation in different waveguides. This is accomplished by designing the waveguides such that the mode of light that propagates in a waveguide has a different effective index of refraction than the mode of light that propagates in the adjacent waveguide. This feature isolates the light propagating in each waveguide, which lends itself to the specialization of functions performed by the waveguides. Light may be transferred between the waveguides via lithographically defined lateral taper couplers, resulting in high-performance lasers, p-i-n and avalanche photodiodes, SOAs, and integrated combinations of these fundamental photonic functionalities. U.S. Pat. Nos. 6,381,380, 6,330,387, 6,483,863, and 6,795,622, the contents of which are hereby incorporated herein by reference in their entirety, provide a description of ATG and various embodiments of ATG.

Applicants have noted unwanted absorption of light in the active layers comprised in couplers of ATG light emitting devices such as lasers and semiconductor optical amplifiers. Electrical pumping has been used to compensate for such absorption loss. However, pumping the taper is undesirable and difficult in some applications. For example, in an integrated electro-absorption modulated laser, a p-n junction is formed at the passive waveguide and must be biased independently from the active junction. Thus, the current through the taper must return to the n-contact via the narrow n-type path between the active and passive waveguides. This narrow and resistive current path makes pumping the taper difficult.

SUMMARY

Applicants disclose herein asymmetric twin waveguide (ATG) structures that employ quantum-well intermixing (QWI) to reduce absorption loss. QWI relies on the mixing of the quantum well and barrier materials of an active region, resulting in an alloy whose bandgap is intermediate between that of the wells and barriers.

In an illustrative embodiment, a monolithically integrated device has a first mode of light and second mode of light propagating therein. The illustrative device comprises a first waveguide and a second waveguide optically coupled to the first waveguide wherein the first mode of light and the second mode of light are divided unequally between the first waveguide and the second waveguide. The second waveguide has a lateral taper formed therein for guiding light between the first waveguide and the second waveguide and comprises a plurality of quantum wells separated by a plurality of barriers. In the illustrative embodiment, the plurality of quantum wells and the plurality of barriers are intermixed. The intermixing may be implemented, for example, using plasma-enhanced intermixing, and results in a reduction in absorption loss that otherwise would be encountered. In an embodiment, argon plasma enhanced intermixing is employed.

Other features are described below.

BRIEF DESCRIPTION OF THE DRAWINGS

The foregoing summary and the following additional description of the illustrative embodiments may be better understood when read in conjunction with the appended drawings. It is understood that potential embodiments of the disclosed systems and methods are not limited to those depicted.

In the drawings.

DESCRIPTION OF ILLUSTRATIVE EMBODIMENTS

Figure 1:
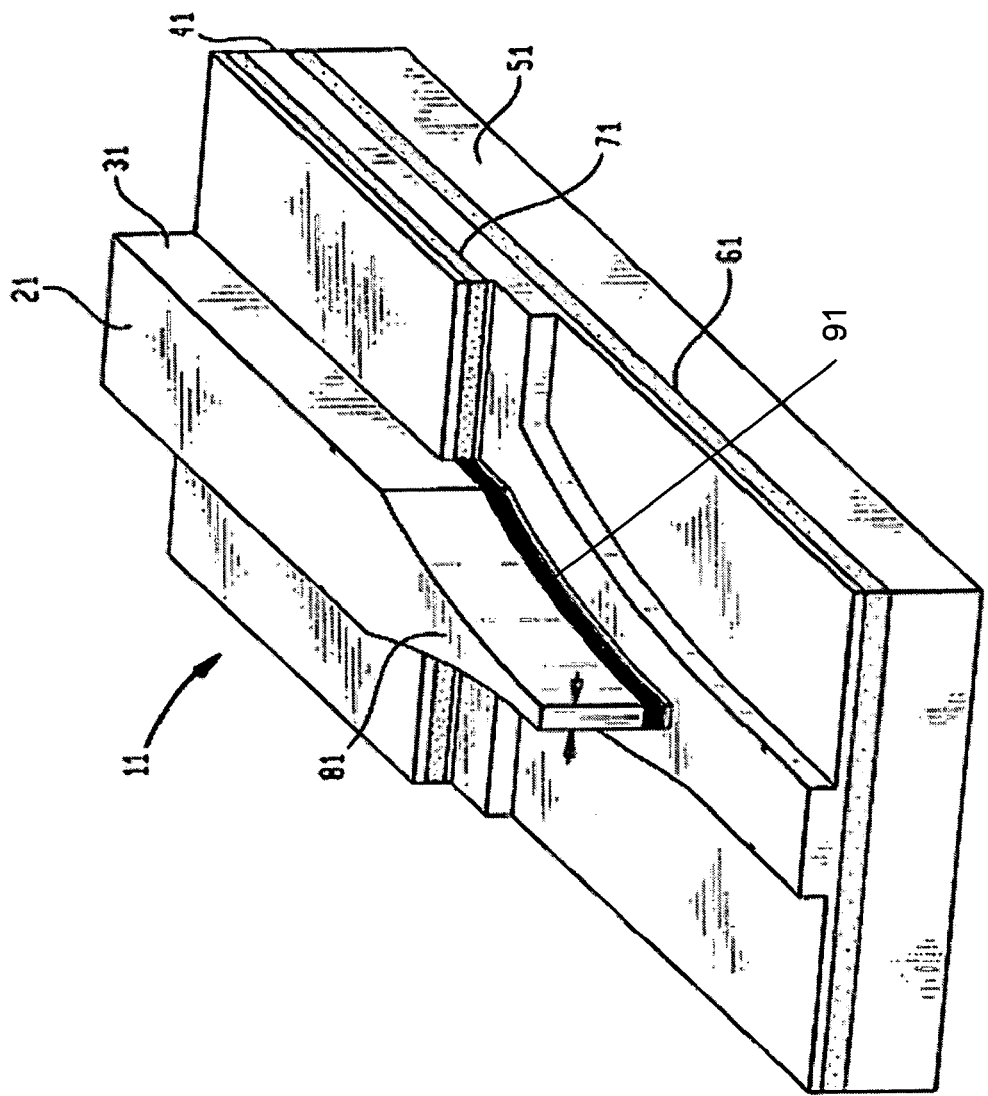
FIG. 1 is a perspective view of an asymmetric twin waveguide laser with an intermixed region in the taper.

FIG. 1 provides a perspective view of an asymmetric twin waveguide (ATG) device or structure 11 with taper region 81. In an illustrative embodiment, and for descriptive purposes only, structure 11 is a laser. Those skilled in the art recognize that while structure 11 is described as a laser in the illustrative embodiment, the ideas disclosed herein may be applied to other devices such as, for example, photo-detectors, optical amplifiers, or similar devices. Exemplary ATG devices to which the principles discussed herein may be applied include those described in U.S. Pat. Nos. 6,381,380, 6,330,387, 6,483,863, and 6,795,622, the contents of which are hereby incorporated by reference in their entirety. In the ATG structure 11 of the illustrative embodiment, a first mode of light and a second mode of light are divided unequally between a first waveguide 61, which is a passive waveguide, and a second waveguide 71, which may be an active waveguide. Waveguides 61 and 71 have differing indices of refraction, resulting in the uneven division of light in the region where the waveguides overlap. The first mode of light is confined primarily to the active waveguide 71, while the second mode is confined primarily to the passive waveguide 61.

The stacked waveguide layers 61 and 71 may be InGaAsP waveguides. The passive waveguide 61 is grown on substrate 51, which may be, for example, an InP substrate. The waveguide layers are separated by cladding layer 41, which may be, for example, InP cladding layer. Cladding layer 41 has a lower index of refraction than waveguides 61 and 71 and is substantially transparent to the movement and coupling of light between waveguides 61 and 71. Contact layer 21, which may be, for example, an InGaAsP layer, is grown on top of the top of a second cladding layer 31.

A shallow ridge waveguide with a taper 81 is incorporated in the upper active layer 71. In an illustrative embodiment, taper 81 is a lateral taper with an exponential shape. Taper 81 may, however, have other geometries and shapes. Active waveguide 71 includes multiple quantum wells separated by barrier materials. In the illustrative embodiment, an intermixed region 91 is formed in taper 81 wherein the multiple quantum wells are intermixed with the barrier materials. Intermixed region 91 substantially reduces the absorption loss normally associated with transferring light between waveguides 61 and 71.

Figure 2:
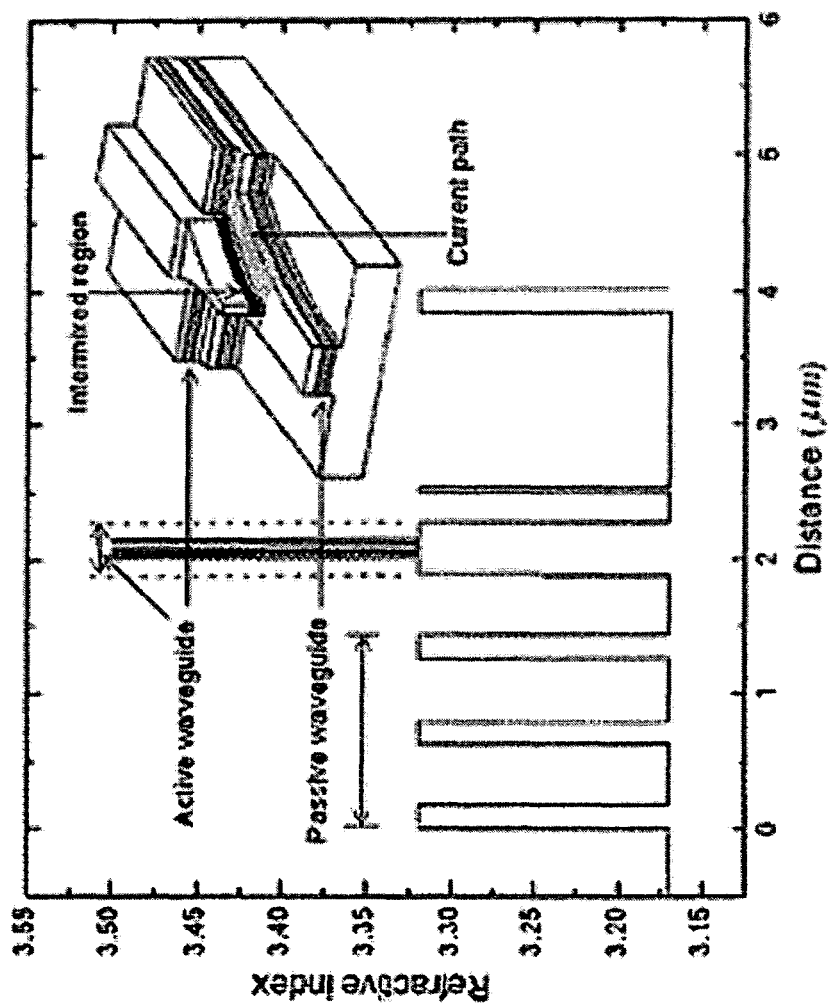
FIG. 2 is a refractive index profile of an asymmetric twin waveguide structure.

Structure 11 may be grown by gas source molecular beam epitaxy on an n+ S-doped (100) InP substrate 51 at 480° C. Passive waveguide 61 may consist of three periods of lattice-matched 175-nm-thick InGaAsP (with a peak emission wavelength of $\lambda p = 1.15$ µm) layers interleaved between 0.45-µm-thick InP layers. In an exemplary embodiment, six 7.2-nm-thick 0.8% compressively strained InGaAsP quantum walls are separated by 22-nm-thick InGaAsP ($\lambda p = 1.15$ µm) barriers, comprising active region 71. The well structure is sandwiched between two 120-nm-thick InGaAsP ($\lambda p = 1.15$ µm) separate confinement layers 31 and 41. A 220-nm-thick InGaAsP ($\lambda p = 1.15$ µm) etch stop layer, a 1.3-µm-thick InP cladding layer, and a 170-nm-thick InGaAsP ($\lambda p = 1.15$ µm) contact layer 21 are sequentially grown onto the active waveguide surface. The strain and thickness of each layer may be measured by double-crystal X-ray diffraction as well as by scanning electron micrographs of the wafer cross section. FIG. 2 illustrates the refractive index profile of illustrative ATG structure 11.

In an illustrative embodiment, taper region 81 is approximately 150 µm long, tapering from 1 to 1.7 µm, followed by a 50-µm-long linear taper from 1.7 to 3 µm. The shape of the taper may be optimized for maximum power transfer efficiency with reasonable fabrication tolerances using a three-dimensional beam propagation model. During the fabrication process, the taper width may deviate from its optimal values, an effect that was simulated assuming that the variation in taper width along its length is constant. This condition is generally met since the width variation is caused by either over- or under-development of the photo-resist mask. The transfer efficiency of this illustrative embodiment is greater than 83% over a 0.3-µm variation in taper width.

In an illustrative embodiment, taper 81 has a quantum well intermixed region 91 formed therein. QWI intermixed region 91 might be formed by several different techniques such as, for example, impurity-free vacancy disordering (IFVD), ion implantation, low temperature grown InP (LT-InP) cap-induced intermixing, and plasma-enhanced QWI. The IFVD method typically requires high annealing temperatures (>750° C.) to achieve a large blue shift, which can have adverse consequences on InP-InGaAsP device stability. Ion implantation occurs at high-energy (~100 keV), which may lead to deterioration of the material quality, and an increase in the laser threshold current. The use of an LT-InP cap layer may require that the cap be close to the quantum wells to induce a large blue shift. Since it may be difficult to grow crystalline materials on top of the LT-InP layer, this may ultimately limit the range of possible structures.

Figure 3:
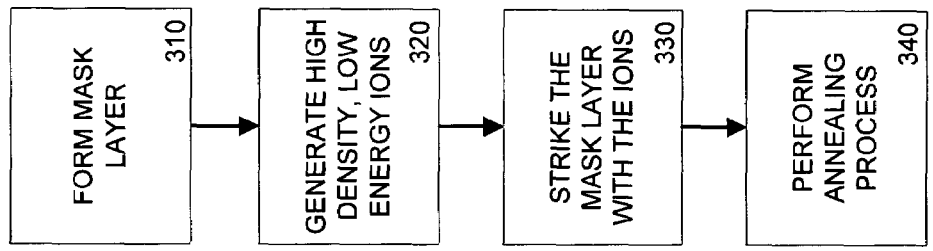
FIG. 3 is a flowchart depicting a method for manufacturing an intermixed quantum well region in an asymmetric twin waveguide structure.

Plasma enhanced QWI is a desirable option for forming intermixed region 91 in taper 81. A method for creating QWI intermixed region 91 using plasma enhancement is depicted in FIG. 3. At step 310, a mask layer is formed. This mask layer may be, for example, a lithographically patterned $SiN_x$ mask layer grown by plasma-enhanced chemical vapor deposition. At step 320, high-density ions with relatively low energies are generated. The ions' energy may be, for example, approximately 200 electron-volts. The generation of the ions may occur by an inductively coupled plasma (ICP). At step 330, the ions strike the sample surface, resulting in vacancies, interstitial defects, and vacancy-interstitial pairs. At step 340, an annealing process occurs during which defects are diffused through the quantum wells. This diffusion results in a significant intermixing between the quantum wells and barriers. In one embodiment, Argon is the atomic source. Argon's relatively large atomic weight leads to efficient sputtering of atoms, thereby producing a high density of surface defects.

In an embodiment, the parameters used to induce plasma-enhanced QWI may be: 90-sccm Ar flow, 30-mTorr chamber pressure, 200-W radio frequency power, and an ICP power of 300 W, 60° C. substrate temperature, and 15 minutes of exposure time. After plasma exposure, the sample is annealed at 650° C. for 150 seconds in a forming gas ambient. During annealing, the sample is capped with a second InP wafer to provide a phosphorous overpressure. The annealing temperature may be chosen to be as low as possible to prevent surface decomposition while achieving the required blue shift in emission.

Figure 4:
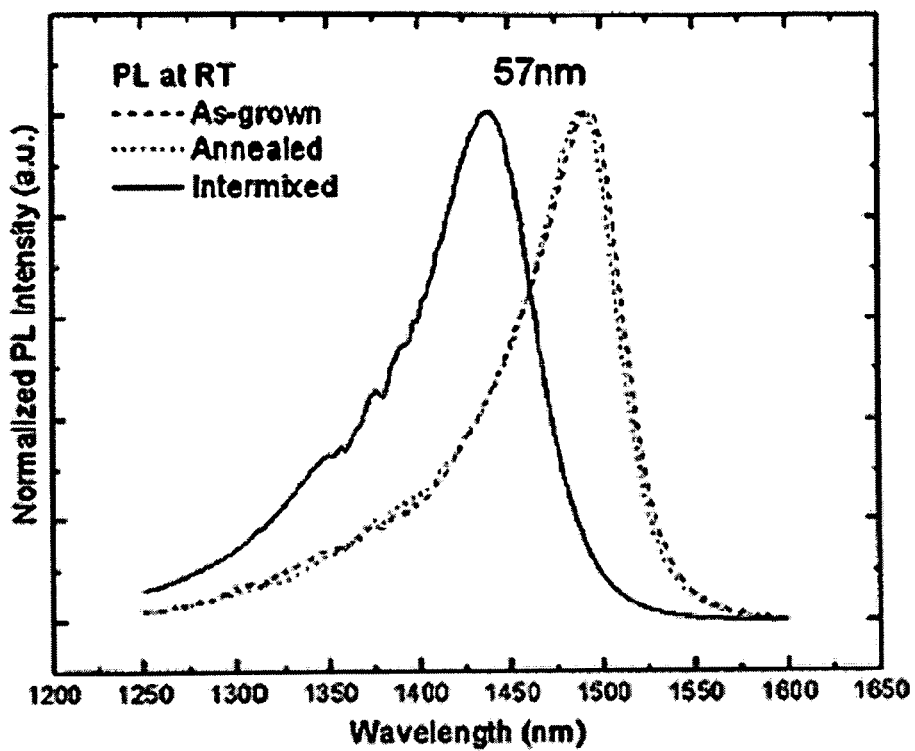
FIG. 4 is a depiction of the photoluminescence spectra of several asymmetric twin waveguide structures.

A photoluminescence (PL) spectra of several ATG lasers may be computed to illustrate the advantage of the plasma-enhanced QWI process. A photoluminescence (PL) peak at a wavelength of $\zeta p = 1.49$ µm is observed on pumping by a 750-mW, $\lambda = 0.488$ µm Ar+laser. FIG. 4 shows the normalized PL spectra of an as-grown sample, a sample experiencing the same annealing procedure without intermixing, and an intermixed and annealed sample. The intermixed sample (illustrated by the solid line in FIG. 4) exhibits a blue shift of $\Delta\lambda = (57 \pm 5)$ nm, while the amount of blue shift of the annealed sample without intermixing is less than the growth non-uniformity of the wafer emission wavelength. The full-width at half-maximum (FWHM) broadening of the intermixed sample is $\Delta FWHM = (12 \pm 5)$ nm, indicating minimal material degradation due to intermixing. Since the atoms at the sample surface are continuously sputtered away by Ar ions during exposure, there is a compromise between the amount of blue shift induced in emission wavelength and the amount of sputtering damage. Increasing the exposure time or the ICP power produces larger ΔλA, but at the expense of material removal by sputtering. A tolerable thickness reduction of 0.5 μm is observed, leaving a 1.2-μm InP cladding layer on top of the quantum wells. This is sufficiently thick to minimize absorption losses at the metal contact.

Three types of ATG lasers further illustrate advantages of the plasma-enhanced QWI process. The three ATG laser types are the following: lasers with intermixed but unpumped tapers; lasers with unpumped, non-intermixed tapers; and lasers with electrically pumped, non-intermixed tapers. Intermixing in the taper regions employed a lithographically patterned $SiN_x$ layer as a mask. After annealing, the sample was etched in 1 HBr: 10 $H_2O$ plus a few drops of $H_2O_2$ for several seconds to smooth the surface of the intermixed regions. Standard processing steps were then performed as described above. Finally, the rear facets of the lasers were cleaved to form 0.6-mm-long cavities (taper length not included), and the front facets consisted of cleaved passive waveguide sections, as shown in FIG. 2.

Figure 5:
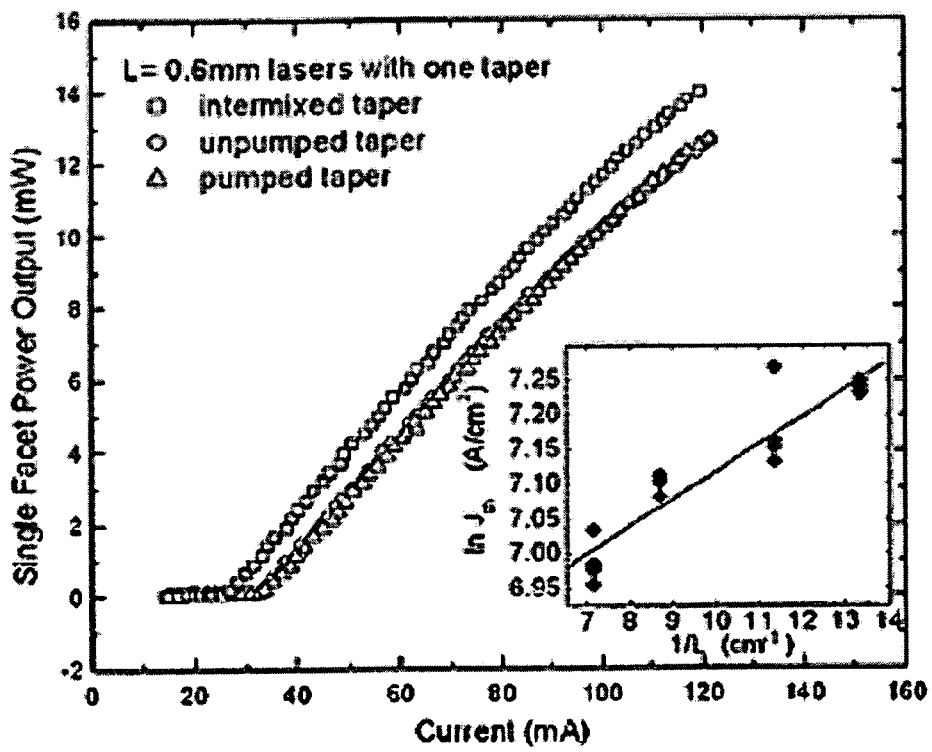
FIG. 5 is a depiction of an output power-current characteristics of several asymmetric twin waveguide structures.

The unpackaged lasers were driven by a current pulse with a 2% duty cycle at a 10-KHz repetition rate at room temperature. FIG. 5 shows the output power measured from the passive waveguide facet versus current (L-I) characteristics of the above-mentioned three laser types. Measurements on five lasers of each type were performed. The variances are less than 3%. The threshold current is (27±1) mA for intermixed lasers as compared to (33±1) mA for the other two types of lasers, representing a reduction of (18±1) %. The total metal contact area as the effective device dimension is used to determine the threshold current densities, resulting in (1.5±0.1) kA/cm2, (1.8±0.1) kA/cm2, and (1.5±0.1) kA/cm2, for the intermixed, unpumped, and pumped taper lasers, respectively. Although electrically pumping the taper does not result in a decrease in the threshold current, it nevertheless decreases the threshold current density, as expected. The intermixed and pumped taper lasers have the same threshold current densities, indicating that the absorption loss in the taper after intermixing is negligible. The multimode spectrum has a peak at λ=1510 nm, with no appreciable difference in lasing wavelengths between lasers with and without intermixed tapers.

The reduction of the absorption loss within the unpumped tapers may be estimated. The unsaturated gain varies with the injection current density as: $g(J)=g_o\ln(J/J_{tr})$, where $J_{tr}$ is the transparency current density and $g_o$ is a constant. For Fabry-Pérot lasers at threshold: $g(J_{th})=\alpha_i+1/L \ln(1/R)=g_o\ln(J_{th}/J_{tr})$, where $\alpha_i$ is the internal loss, L is the cavity length, and R is the mirror reflectivity. Then: $\ln(J_{th})=\ln(J_{tr})+(\alpha_i/g_o)+(1/g_oL)\ln(1/R)$.

Given the internal loss $\alpha_i$ and the reflectivity R, $J_{tr}$ and $g_o$ are obtained. Then the difference between the threshold gains for intermixed and unpumped taper lasers is calculated from the ratio of their threshold current densities. This difference in threshold gains completely compensates for the extra absorption loss in the unpumped taper, which is then estimated in turn. The inset of FIG. 5 shows the linear fit of $\ln(J_{th})$ versus (1/L), to obtain go=33 $cm^{-1}$ and $J_{tr}$=700 $A/cm^2$, leading to $\Delta g_{th}$=6.9 $cm^{-1}$. This compensates for a taper absorption loss of 34%, or 1.8 dB.

Thus, the absorption loss in lateral tapers of ATG lasers in the absence of pumping is significantly reduced using Argon plasma-enhanced QWI. In an illustrative embodiment, a blue shift of (57±5) nm in peak emission wavelength is achieved with a linewidth broadening of (12±5) nm. The threshold current is reduced from (33±1) to (27±1) mA upon intermixing of the taper regions. The absorption loss in the taper is estimated to be 1.8 dB, and becomes negligible after intermixing. QWI eliminates the requirement of pumping the tapers, thereby simplifying the fabrication of ATG components, such as, for example, ATG-based emitters integrated with electro-absorption modulators and semiconductor optical amplifiers (SOAs) integrated with a detector through an intermediate waveguide layer.

It is noted that the foregoing examples have been provided merely for the purpose of explanation and are in no way to be construed as limiting of the present invention. While the invention has been described with reference to laser embodiments, it is understood that the words which have been used herein are words of description and illustration, rather than words of limitation and that other device such as in detectors, amplifiers, or any other ATG device are suitable embodiments. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims.

What is claimed is:

1. A monolithically integrated device having at least a first mode of light and second mode of light propagating therein, comprising:
   a first waveguide having a first effective index of refraction; and
   a second waveguide coupled to the first waveguide, said second waveguide having a second effective index of refraction and having a taper formed therein for moving light between said first waveguide and said second waveguide;
   wherein the first mode of light and the second mode of light are divided unequally between the first waveguide and the second waveguide, and
   wherein said second waveguide comprises a plurality of quantum wells separated by a plurality of barriers, and
   further wherein in the taper the plurality of quantum wells and the plurality of barriers are intermixed using plasma-enhanced intermixing.

2. The device of claim 1, wherein the plurality of quantum wells and the plurality of barriers are intermixed using Argon plasma-enhanced intermixing.

3. The device of claim 1, wherein the first mode of light is primarily confined to the first waveguide and the second mode of light is primarily confined to the second waveguide.

4. The device of claim 3, wherein the second waveguide comprises an active region for amplifying light propagating therein.

5. The device of claim 1, wherein the taper is a lateral taper.

6. The device of claim 5, wherein the lateral taper has an exponential curve.

7. The device of claim 1, wherein said second waveguide has a higher effective index of refraction than said first waveguide.

8. The device of claim 1, wherein said device comprises a laser.

9. The device of claim 1, wherein said device comprises at least one of the following: an optical detector and an optical amplifier.

10. An optical device, comprising:
a first waveguide having a first effective index of refraction and for guiding primarily a first mode of light;
a second waveguide having a second effective index of refraction and for guiding primarily a second mode of light;
a taper formed in said second waveguide, said taper comprising a plurality of quantum wells separated by a plurality of barriers,
wherein in the taper the plurality of quantum wells and the plurality of barriers are intermixed using plasma-enhanced intermixing.

11. The device of claim 10, wherein the plurality of quantum wells and the plurality of barriers are intermixed using Argon plasma-enhanced intermixing.

12. The device of claim 11, wherein the second waveguide comprises an active region for amplifying light propagating therein.

13. The device of claim 10, wherein the taper is a lateral taper.

14. The device of claim 13, wherein the lateral taper has an exponential curve.

15. The device of claim 10, wherein said second waveguide has a higher effective index of refraction than said first waveguide.

16. The device of claim 10, wherein said device comprises a laser.

17. The device of claim 10, wherein said device comprises at least one of the following: an optical detector and an optical amplifier.

* * * * *